DYNAMIC BISTABLE OR CONTROL CIRCUIT

Filed March 7, 1957 2 Sheets-Sheet 1

INVENTOR.
EUGENE O. KEIZER
BY [signature]
ATTORNEY

INVENTOR.
EUGENE O. KEIZER
BY
ATTORNEY

United States Patent Office 2,964,637

Patented Dec. 13, 1960

2,964,637

DYNAMIC BISTABLE OR CONTROL CIRCUIT

Eugene O. Keizer, Princeton, N.J., assignor to Radio Corporation of America, a corporation of Delaware Filed Mar. 7, 1957, Ser. No. 644,582

18 Claims. (Cl. 250—211)

This invention relates to a dynamic circuit having a bistable characteristic and alternatively a sensitive output-input characteristic.

The circuit of the invention employs a variable-capacitance type semi-conductor junction. When driven by a high-frequency A.-C. source, the circuit may be designed to have either a bistable characteristic suitable, for example, to use as a dynamic memory element, or a voltage or light sensitive output-input characteristic suitable, for example, for control or detection purposes.

The present invention is similar in operation to circuits utilizing either the ferromagnetic or the ferroelectric effect. Dielectric amplifiers, for example, operate on the principle of controlling, by a low power source, the A.-C. reactance of a capacitance element. The duality which exists between magnetic and dielectric amplifiers utilizing the ferromagnetic or the ferroelectric effect, respectively, is set forth in an article entitled "Dielectric Amplifier Fundamentals," appearing on page 84 of the December 1951 issue of "Electronics." This article points out some of the disadvantages of dielectric amplifier circuitry. One of these disadvantages is that relatively low frequencies are required. Also the capacitance tends to vary with temperature. Further, none of the presently known dielectric circuitry provide a simple A.-C. energized bistable circuit requiring only, for example, an inductor, a capacitor, and a variable capacitance junction diode.

Accordingly, it is an object of this invention to provide an improved dynamic circuit employing a variable capacitance semi-conductor device.

Another object of this invention is to provide an improved dynamic bistable circuit employing a variable capacitance PN junction, which circuit is simpler than those of the prior art.

A further object of this invention is to provide an improved dynamic light controlled circuit.

Still another object of this invention is to provide an improved A.-C. energized bistable circuit that switches faster and requires lower switching power than those of the prior art.

In accordance with this invention, circuits are disclosed which make use of the rectification characteristic and voltage sensitive junction capacitance characteristic of semi-conductor devices. The rectifying action provides self bias across the junction and thus controls the capacitance of the device. When such a semi-conductor device having a junction of two different conductivity semi-conductive materials is placed in a circuit with an inductance and a second capacitor to form a resonant circuit and energized with a high frequency A.-C. source, a sensitive bistable or control circuit is obtained. When a light sensitive semi-conductor device is employed, a light energy responsive control circuit is formed.

The novel features of this invention as well as the invention itself, both as to its organization and method of operation, will best be understood from the following description, when read in connection with the accompanying drawings, in which like reference numerals refer to like parts, in which.

Figures 1, 10:
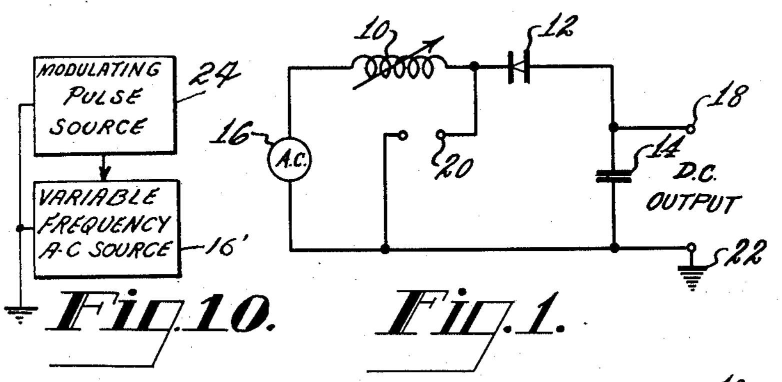
Figure 1 is a circuit diagram of a basic series fed bistable or control circuit in accordance with this invention.
Figure 10 is a block diagram of a variable frequency A.-C. source and means for pulse modulating said source.

Referring now to Figure 1, a basic series fed bistable circuit in accordance with this invention is illustrated. In Figure 1, a tunable inductor 10, a variable capacitance junction diode 12, and a capacitor 14 are connected in series with a high frequency source 16 of constant frequency variable voltage alternating current (A.-C.). The capacitor 14 and inductor 10 are standard circuit elements of their respective types. The inductor may have a core or not as may be necessary for the values of inductance desired. The A.-C. source 16 may be any type of high frequency low impedance voltage source capable of providing an output of several milliwatts. A suitable A.-C. source, for example, is a transistor oscillator whose output is coupled through an emitter follower amplifier to the circuit of Figure 1. The A.-C. source 16 must provide a path for direct current flow for reasons that will become apparent below. For providing bistable operation, the A.-C. source 16 may be capable of providing a variable voltage output level or frequency. The variable capacitance junction diode 12 may be a diode of the type described in an article entitled "A Variable Capacitance Germanium Diode for UHF," by Giacoletto and O'Connell, appearing on page 221 of "Transistors I," published March 1956, by RCA Laboratories, Princeton, New Jersey. In the Giacoletto article, it is stated that a junction of two dissimilar semi-conductors constitutes a diode in which, if biased in the reverse (non-conducting) direction, the mobile charge carriers are moved away from the junction, leaving uncompensated fixed charges in a region near the junction. From this, it is apparent that the width and hence the electrical charge of this region (spaced charge layer) depends on the applied voltage, thereby giving rise to a junction transition capacitance. In this regard, it may be noted that the desired capacitance for a particular bias voltage determines the area of the junction.

This particular capacitive effect given by a junction or present at a junction of two dissimilar semi-conductive materials, is also described on page 12 of the book "Principles of Transistor Circuits" by R. F. Shea, published October 1953 by John Wiley and Sons, Inc., which states, "The barrier charge increases with voltage, and, therefore, the barrier has a capacitance. The rapid transition junction has an effective A.-C. capacitance which is inversely proportional to the square root of V. The graded junction capacitance is inversely proportional to the cube root of V." It is well known that, in addition to the above-identified capacitive effect, a junction of two dissimilar semi-conductive materials, such as between the so-called P type material in which conduction is principally by holes and the so-called N type material in which conduction takes place principally by electrons, forms an efficient rectifier. The diode 12 in Figure 1 is poled such that the capacitor 14 is charged negatively by the rectifying action of the diode. One side of the A.-C. source is connected to a point of reference potential, such as ground 22.

The operation of the circuit of Figure 1 is based on the combined effects of rectification and the voltage sensitive variable capacitance of the diode 12. When supplied with an alternating potential by the A.-C. source 16, the diode 12 rectifies this A.-C. potential to charge the capacitor 14 negatively with respect to ground 22 to provide its own direct current (D.-C.) reverse bias. D.-C. outputs from the circuit of Figure 1 may be taken from across the capacitor 14 from an output terminal 18 with respect to ground 22. As stated above, because of the polarity of the diode 12, the negative peaks of the alternating voltage appearing across the diode are rectified, thereby providing a negative charge on the capacitor 14, which appears as a negative output at the output terminal 18 with respect to ground. This negative charge which builds up across the capacitor 14 functions to reverse bias the diode 12. In theory a resistive load or some other D.-C. path must be provided across the capacitor 14 to allow the charge to leak off. In practice, however, such leakage may take place through the back resistance of the diode 12, through the leakage resistance of the capacitor 14, or through the load placed between the D.-C. output terminal 18 and ground 22. As the reverse bias is increased, the capacitance at the junction of the junction diode 12 decreases and, correspondingly, the capacitive reactance of the diode 12 increases. This effect enables the circuit to have two stable states of operation if the frequency provided by the input voltage source 16 is within the resonant range as determined by the circuit parameters including the variable capacitance diode 12.

Figure 2:
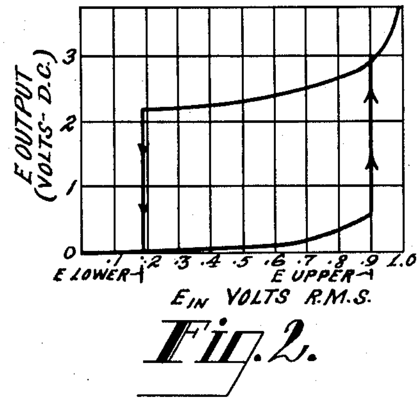
Figure 2 is a curve illustrating a typical bistable characteristic resulting from the circuit of Figure 1.

The two stable states may be seen from the curve in Figure 2. In Figure 2 the ordinate is the negative D.-C. output voltage appearing at the D.-C. output terminal 18 of Figure 1 with respect to ground 22. The ordinate thus represents the charge built up in the capacitor 14, or the magnitude of reverse bias across the diode 12. A.-C. input voltages provided by the A.-C. source 16, are represented on the abscissa in Figure 2. The curves illustrated in Figure 2 were obtained by first gradually increasing then gradually decreasing the voltage of the A.-C. input from the A.-C. source 16. It is apparent from Figure 2 that, for certain input voltage levels, two widely different D.-C. outputs are possible. The circuit may be triggered between these two stable states by voltage pulses, temporary input level or frequency changes, or by other means. In the lower one of these two stable states the series resonant frequency of the circuit is slightly below the frequency of the A.-C. source 16 and the circuit presents an inductive load to the A.-C. source 16. In the higher of the two states, the circuit presents a capacitive load to the A.-C. source 16. When triggered, or when a critical amplitude or frequency is reached, the circuit passes through resonance abruptly from one of the two stable states to the other. The minimum time required for transition has been found to be three to ten cycles of the exciting frequency. It is noted from the voltage scales employed in Figure 2 that a very large D.-C. output voltage results relative to the A.-C. input voltages employed due to operating at or close to series resonance.

Figure 3:
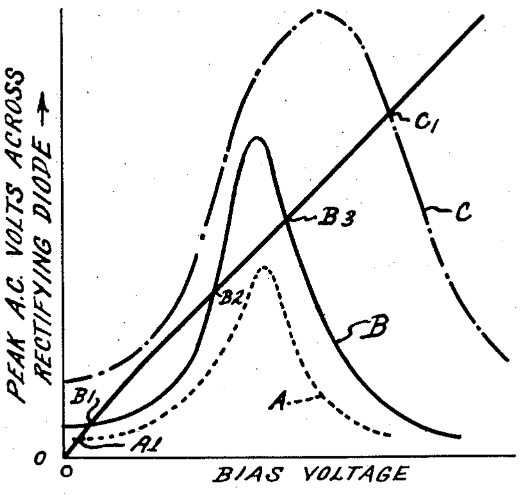
Figure 3 illustrates curves showing the response of the variable capacitance junction diode of Figure 1 to various biases obtained in operation with various input voltage levels.

The operation of the bistable circuit of Figure 1 may be more readily understood with the aid of Figure 3. The approximately straight line at an angle through the origin represents the reverse bias developed by junction diode rectification as related to the peak A.-C. voltage across the diode. The straight line shows the rectification characteristic only and disregards the capacitive effect of the diode. Thus, the curves of Figure 3 are plotted with the negative reverse bias voltage developed across the diode of Figure 1 as the abscissa and the peak A.-C. voltage across the diode as the ordinate. The remaining curves A, B, and C in Figure 3 are response curves illustrating only the capacitive effect of the diode. The manner in which the A.-C. voltage varies as the reverse bias is changed is indicative of the capacitive reactance and thus the capacitance of the diode. Note that the curves A, B, and C pertain to the variable capacitance characteristic of the diode only and assume that there is no diode conduction. The several curves A, B, and C, respectively, are plotted for different A.-C. input voltage levels, respectively. All steady state operating points must fall on a point of intersection between the approximately straight bias versus A.-C. curve, and the response curve corresponding to the A.-C. input level being supplied, to satisfy both diode capacitance and diode rectification characteristics. A detailed consideration of the intermediate response curve B, shown as a solid line, will show this rule to be true.

Thus, an inspection of Figure 3 shows that there are three points of intersection, B1, B2, and B3 of the response curve B with the reverse bias straight line. Two of the points, B1 and B3, are stable points. The middle point, B2, is unstable. If the circuit is momentarily made to operate in the region between B1 and B3, it will immediately move toward operation at one stable operating point, B1 or B3. In this as in all cases, the circuit moves from the initial operating point to one of the stable operating points, B1 or B3. Such is the case when the circuit is first energized by the A.-C. source 16 and the operating point moves to the closer stable operating point, B1.

The stability of a stable operating point, such as B1, comes from the equilibrium between bias voltage and peak A.-C. volts across the rectifying diode 12. If the initial operating point is immediately to the right of B1, the response curve shows that the supply of peak A.-C. volts is not great enough to satisfy the demands for peak A.C. volts given by the reverse bias straight line. This causes a movement to the left which continues until the supply of and demand for peak A.-C. volts across the rectifying diode 12 are equal, which occurs at B1. However, if the initial operating point is to the left of B1, the response curve shows that the supply of peak A.-C. volts is greater than the demand for peak A.-C. volts given by the reverse bias straight line, causing movement to the right which continues until equilibrium is reached at the stable operating point B1. The point B3 may be shown to be stable by the same philosophy applied above with reference to the stable point B1. The point B2 is unstable since at this point any increase in the response voltage provides a resulting increase in the reverse bias appearing across the diode 12. Also, any decrease in the response voltage provides a corresponding decrease in the reverse bias developed by the diode. Either of these effects is cumulative such that the circuit operating point is driven to one or the other of the stable points B1 or B3.

In summary, once the operating point reaches a stable operating point, the circuit will remain at that stable point, except when something is done to the circuit to upset equilibrium.

The significance of the upper critical level of Figure 2 may be better explained by a further consideration of the curves of Figure 3. Assume that the input level of the A.-C. source 16 is temporarily shifted from that of curve B to that of curve C. Assume also that the circuit of Figure 1 is presently operating at the stable point B1. With the input level shift, the increase in response voltage results in a continuing increased reverse bias across the diode 12 until the stable point C1 is reached. Once the temporarily increased input level is removed back to that of the curve B, the operating point of the circuit falls back to the stable point B3. Thus, if the circuit is initially in a low level state and the input level is raised through this upper critical level ($E_{upper}$, Figure 2) an abrupt increase in the output will occur. If, however, the circuit is in an initially high level state as represented by the point B3, for example, an increase in the input level will have only a small effect on the output, such as shifting from a stable point B3 to C1.

A reduction of the input below the lower critical level ($E_{lower}$ as illustrated in Figure 2) will result in the circuit returning to a low level state as, for example, stable point B1, abruptly if it had previously been in the high level state, for example, stable point B3. This particular action is more easily described by assumption that the A.-C. source 16 input level corresponding to curve B of Figure 3 is momentarily shifted down to the input level corresponding to curve A. It is noted that the response curve A has no intersection with the diode bias curve in the B3 region. The lower critical level ($E_{lower}$, Figure 2) has thus been exceeded and with the reduced voltage available for rectification across the diode 12, the reverse bias falls until the stable point A1 is reached. With the return of the input level back to that of B, the operating point changes to B1.

The bistable circuit of Figure 1 may be triggered from one of its two stable states to the other by applying from an external source a bias voltage across the diode 12, by pulse amplitude modulating the A.-C. source 16, by varying the frequency of the A.-C. source 16, or by coupling another input signal to the circuit through a transformer in place of the inductor 10, which other input signal either effectively adds to or subtracts from the input signal from the A.-C. source 16. Other methods will be apparent to those skilled in the art.

Figure 10 illustrates in block form a variable frequency A.-C. source 16' and a modulating pulse source 24 coupled to the A.-C. source 16'. The A.-C. source 16' may be, for example, a transistor oscillator arranged to provide variable frequency output signals. The modulating pulse source 24 may be any suitable pulse source.

For a given constant A.-C. voltage input in the bistable region there are also upper and lower critical frequencies. These critical frequencies are determined by the circuit parameters and the range over which the capacitance of the diode 12 may be varied.

The following values were employed in one successful circuit built in accordance with the invention: The inductor 10 was 100 microhenrys; the capacitor 14 was 300 micromicrofarads; and the variable capacitance junction diode 12 was of the type described in the "Transistor I" article having sufficient capacitance to form a resonant circuit with the inductor 10 and capacitor 14 at 1.95 megacycles per second A.-C. input. These values are given by way of illustration and should not be construed as a limitation.

An A.-C. output from the circuit may be taken from between the A.-C. output terminal 20 and ground 22. The voltage magnitude of the A.-C. output is representative of the stable state of operation as is apparent from the A.-C. response curves of Figure 3.

As in many resonant circuits, the "Q" of the circuit of Figure 1 at the source frequency has a considerable effect upon the performance characteristics. It should be pointed out that to obtain a large ratio of upper to lower critical voltage amplitudes, a high "Q" (ratio of the reactance to resistance) is needed. As the "Q" is reduced as, for example, by raising the source resistance or by resistive loading of the A.-C. output 20 or the D.-C. output 18, the critical amplitudes move closer together. When the "Q" has been thus reduced beyond a critical point, the upper and lower critical voltages coincide and for this critical 'Q" and for lower "Q's" the circuit is no longer bistable. However, in this region the output amplitude is very sensitive to changes in source frequency, source amplitude, or to control signals applied, for example, across the variable capacitance diode 12 of Figure 1. The function in this instance is similar to that of a dielectric amplifier. As such, the circuit may find use in control or detector applications. For example, if the input level is held constant as by a limiter, a sensitive frequency discriminator is formed.

Figure 4:
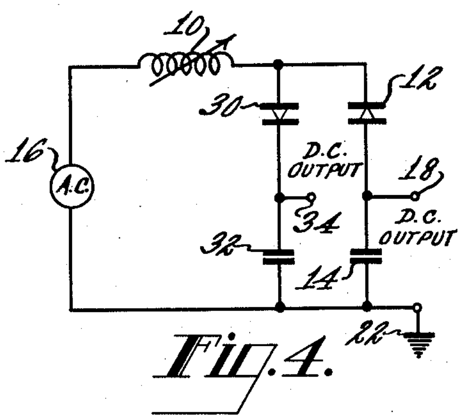
Figure 4 is a circuit diagram illustrating an embodiment of the invention in which two variable capacitance junction diodes provide both polarities of D.-C. output.

Referring to Figure 4, an embodiment is illustrated which, although similar to Figure 1, provides both polarity D.-C. outputs. Thus, in Figure 4, the alternating current source 16 is serially connected through the tunable inductor 10 to the series combination of the variable capacitance diode 12 and capacitor 14 placed in parallel with the series combination of a second variable capacitance diode 30 and a capacitor 32. The second diode 30 is poled in the opposite direction to that of the diode 12 with respect to the tunable inductor 10. The first D.-C. output for the parallel branch including the diode 12 and capacitor 14 is taken from between the output terminal 18 and ground 22. As in the case of Figure 1, the diode 12 is poled such that the capacitor 14 is charged in a negative direction. Accordingly, the first D.-C. output is negative with respect to ground.

The remaining parallel branch including the diode 30 and capacitor 32 provides a positive D.-C. output, resulting from the diode 30 charging the capacitor 32 in the positive direction. This second D.-C. output is taken from between the second D.-C. output terminal 34 and ground 22. Although the first and second D.-C. outputs are opposite in polarity to each other, both respond as in Figure 2 with a rectangular characteristic to provide bistable circuit operation.

Figure 5:
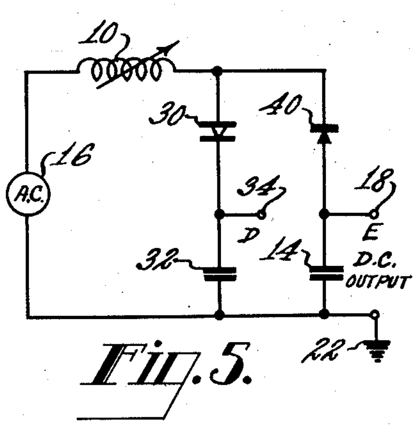
Figure 5 is a circuit diagram illustrating another embodiment of this invention in which one variable capacitance and one rectifying diode are employed to provide both polarities of D.-C. output.

Referring now to Figure 5, the circuit illustrated is substantially identical to that of Figure 4. Accordingly, the same reference numerals denote similar elements. The primary difference is that a rectifying point contact diode 40 has been substituted for the variable capacitance junction diode 12 of Figure 4. The rectifying diode 40, for example, type IN34A has a unidirectional conducting characteristic and does not have an appreciable variable capacitance characteristic. The outputs obtained with the rectifying diode of Figure 5 are illustrated in Figure 6.

Figure 6:
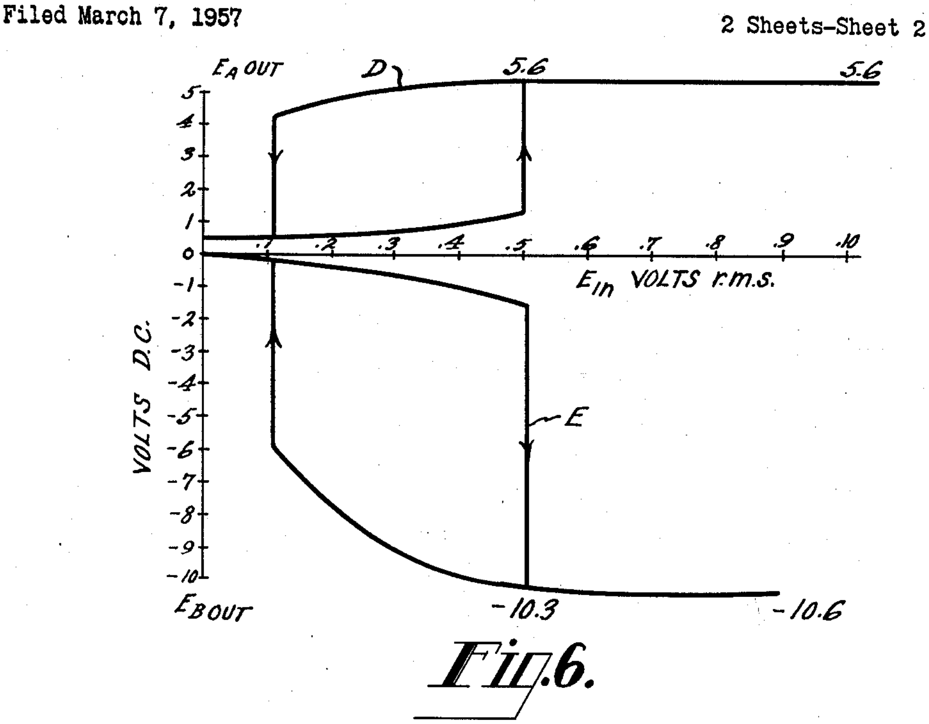
Figure 6 is a curve illustrating the two outputs which are available from the circuit illustrated in Fig. 5.

In Figure 6, the curve labeled "D" is the positive D.-C. output taken from the D.-C. output terminal 34 with respect to ground 22. The curve labeled "E" is the negative D.-C. output characteristic taken from the D.-C. output terminal 18 with respect to ground 22. It should be noted that the lower curve "E" has a larger amplitude (in a negative sense) than the upper curve "D" (in a positive sense). This difference results from the variable capacitance of diode 30. The capacitance varies with the instantaneous voltage across the diode, thereby distorting, for example, the sine wave input from the A.-C. source 16. A non-symmetrically peaked sine wave is thus applied to the diodes 30 and 40. The rectifying diode 40, acting on the negative portions of the sine wave whose positive portions are peaked by the inductor 10, as noted above, is able to develop a larger amplitude D.-C. output than the diode 30.

Figure 7:
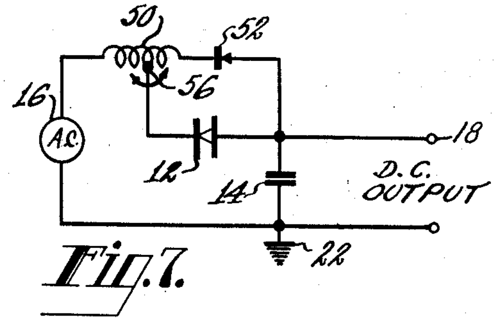
Figure 7 is a circuit diagram illustrating another embodiment in accordance with the present invention for high frequency applications in which the variable capacitance diode does not conduct.

The circuit illustrated in Figure 7 is a circuit which may be employed when a very high source frequency is employed. With a very high energizing frequency, forward conduction in the junction diode with the attendant production of lingering carriers may be undesirable in that the rectifying ability of the diode is decreased. The production of lingering carriers can be avoided by tapping the junction diode 12 connection at some mid-point on the series inductance and connecting a rectifying diode 52 in place of the junction diode. The rectifying diode develops sufficient reverse bias to prevent the junction diode from conducting. Thus, the variable capacitance characteristic of the junction diode is available without the disadvantages of the lingering charge carriers. In Figure 7 the alternating current source 16 is coupled serially through a tapped inductor 50, a rectifying diode 52, and a capacitor 14. The inductor 50 contains a variable position tap 56 such that mutual inductance exists between those portions of the inductor 50 on either side of the tap 56. The variable capacitance junction diode 12 is coupled from the tap 56 to a mid-point between the capacitor 14 and the rectifying diode 52. Both the rectifying diode 52 and the variable capacitance junction diode 12 are poled in such a manner that the capacitor 56 is charged in a negative direction by the A.-C. source 16. Thus, a major portion of the reverse bias for the junction diode 12 is provided by the rectifying diode 52. The loss of rectifying ability by the junction diode 12 is compensated by the rectifying diode 52. The circuit of Figure 7, as well as the other embodiments of the invention, may be triggered from one bistable state of operation to another by the same techniques set forth in conjunction with the embodiment of Figure 1.

Figure 8:
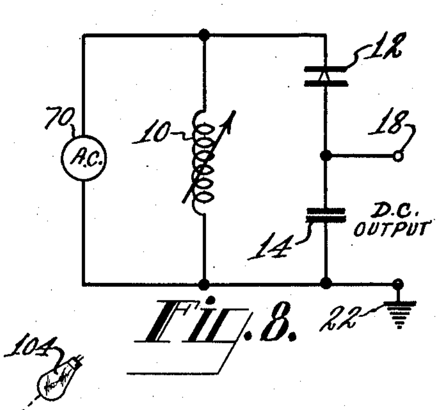
Figure 8 is a circuit diagram illustrating still another embodiment of this invention, namely that of a parallel fed bistable circuit.

The several embodiments of this invention described above are best operated when energized from a low impedance A.-C. source 16 and where operated in the broad vicinity of series resonance. In each case, the variations in reverse bias across the junction diode shift the operating point of the circuit such that a stable state is attained on either side of such series resonance. It is also possible to attain a bistable characteristic from circuits operated from high impedance sources. Such circuits operate in the vicinity of parallel resonance. One such circuit is illustrated in Figure 8. In the circuit of Figure 8, a high impedance alternating current source 70 is employed as the energizing source. A circuit containing two parallel branches is connected across the alternating current source 70. One branch contains a tunable inductor 10; the other branch includes a series connected variable capacitance junction diode 12 and a capacitor 14. The D.-C. output representing the two stable states may be taken from across the capacitor 14 from the D.-C. output terminal 18 and ground 22. Since the operation of the circuit of Figure 8 is similar to that described above, the only difference being that the circuit is operated in parallel resonance, no further explanation is deemed necessary.

In another embodiment of the invention, the basic circuit of Figure 1 may be employed to provide a voltage sensitive or light sensitive amplifier or transducer. In the latter embodiment, the amount of the alternating current energizing signal or the amount of rectified energizing signal appearing at certain points in the circuit may be controlled by changes in capacitance of a voltage sensitive or light sensitive capacitance element or elements.

Figure 9:
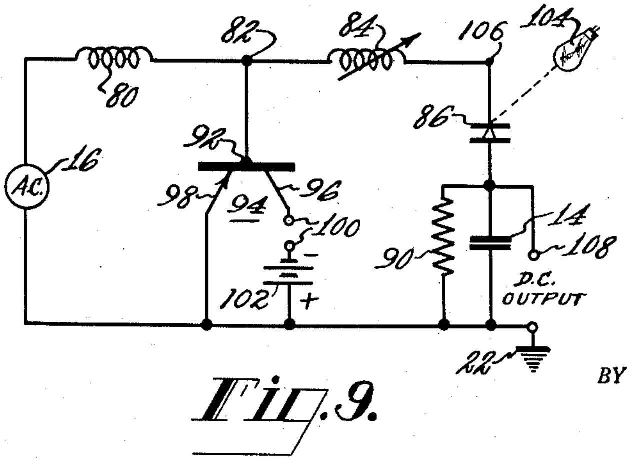
Figure 9 is a circuit illustrating the use of a light sensitive junction diode employed in a light controlled circuit.

Thus, in Figure 9, an alternating current source 16 is provided. The A.-C. source 16 is coupled through a radio frequency (R-F) choke 80 to a common point 82. The common point 82 is, in turn, coupled to a series circuit consisting of a tunable inductor 84, a variable capacitance light sensitive junction diode 86, and a capacitor 14 to ground 22. The alternating current source 16 is also coupled to ground to complete the series circuit. The capacitor 14 is bypassed by a resistor 90. The common point 82 is coupled to the base electrode 92 of a PNP junction transistor 94. The transistor 94 has a collector electrode 96 and an emitter electrode 98. The emitter electrode 98 is coupled to ground 22 and the collector electrode 96 is coupled to one of a pair of output terminals 100. The other one of the pair of output terminals 100 is coupled to the negative side of a direct current source which may, for example, be a battery 102. The positive terminal of the battery 102 is coupled to ground 22.

The light sensitive diode 86 may be any suitable photosensitive diode that has a variable capacitance characteristic, such that the capacitance varies with bias across the diode or with the amount of light energy received by the diode. A suitable diode is a germanium junction photocell of the type described on page 478 et seq. of the above mentioned Shea book. Other suitable forms and materials (silicon, for example) can also be used. A light source 104 is illustrated to control the circuit and is adjusted to be focused or to allow the light energy to fall on the light sensitive exposed area of the photosensitive diode 86. An A.-C. output terminal 106 is also provided from a point on the circuit between the inductor 84 and the diode 86 for a purpose as will be described below. A D.-C. output terminal 108 is also provided from the common point on the circuit appearing between the diode 86 and the capacitor 14 for deriving a rectified D.-C. output representing the response of the circuit.

The circuit of Figure 9 may be operated in two modes, which may be termed the "resonant mode" and the "anti-resonant mode" wherein the terms resonant and anti-resonant describe the condition of the serially connected inductor 84, diode 86, and capacitor 14. In the first mode, namely, the resonant mode of operation, the alternating current energy is applied from the A.-C. source 16 to the circuit of Figure 9. The tunable inductor 84 is adjusted in the absence of any light from the light source 104 to form a series resonant circuit at the frequency of the A.-C. energizing source 16 with the variable capacitance light sensitive diode 86 and the capacitor 14. Because of the low impedance presented by the series resonant portion of the circuit, most of the energizing potential from the A.-C. source 16 is lost across the radio frequency choke 80 such that only a small amount of alternating current voltage appears at the common point 82 with respect to ground 22. When light from the light source 104 is directed on the light sensitive diode 86, its junction capacitance changes, thereby detuning the formerly series resonant portion of the circuit and causing its impedance to rise. This in turn results in an increase in the amount of energizing voltage appearing at the common point 82 with respect to ground. Thus, it is apparent that the amount of light can control the potential at the common point 82 with respect to ground 22 by varying the capacitance of the diode and detuning the circuit. These significant changes in level that occur at the common point 82 with corresponding changes in light energy received by the diode 86 are very well suited for driving low impedance loads such as transistors. Thus, in the case of Figure 9, the transistor 94 is illustrated as being driven by the output of the common point 82. The alternating current levels are applied between the base electrode 92 and the emitter electrode 98 of the transistor 94, thereby effecting a change in the current flow between the base and emitter electrodes. Variation of the emitter-base current flow of the transistor 94 thereby provides an amplified current flow in the collector of the transistor 94 at the output terminals 100. If desired, an output may be taken from the common point 82 and ground directly without the aid of the amplifying action of the transistor.

Relatively large amounts of change in A.-C. potential at the output terminal 106 occur with changes in light from the light source 104. Outputs taken from the output terminal 106 may be employed to drive high impedance loads. Due to the rectifying action of the diode 86, a change in D.-C. output level corresponding to the circuit response is available at the D.-C. output terminal 108.

In its second mode of operation, namely, the anti-resonant mode, the tunable inductor 84 is varied such that the serially connected diode 86, capacitor 14 and inductor 84 have a net capacitive reactance that with the inductance of the choke 80 forms a resonant circuit. Note that the serially connected inductor 84, diode 86, and capacitor 14 are not resonant. The alternating current voltage at the common point 82 is then high when no light is received by the diode 86 and, conversely, low when light is being received. In other words, application of light from the light source results in decrease of the capacitance of diode 86 such that the entire circuit including the choke 80 is detuned from series resonance, such that the voltage at point 82 is lowered. Similar outputs may be obtained from the several points in the circuits as described above. Instead of a light source of control, a change of bias on the variable capacitance diode 86 can be used as a control source as in the case of Figure 1. The uses of the circuit of Figure 9 are many. For example, it may be used as a pickup for sound movies, as an automatic background control in television, or (with appropriate filters) as a color balance indicator in color television, or as an automatic headlight dimmer control in automobiles.

There has thus been described a very simple, efficient, dynamic bistable or control circuit which may find many applications, such as in memories, ring counters, shift registers, or in control and modulating circuits. These and many other applications of the circuit may be apparent to one skilled in the art. For example, where a low impedance load is to be driven, there is the problem of choosing a suitable means of coupling the load to the bistable or control circuit. If the output can be at the energizing frequency, a tap on the series inductance or a link coupled to it can be used. A relatively low impedance A.-C. output can also be obtained across the fixed capacitor. In a case where a low impedance D.-C. output is needed, a serially connected rectifying diode and capacitor may be coupled between the common point 82 of Figure 9 and ground.

What is claimed is:

1. In combination, a first circuit element and a second circuit element, said first circuit element including a P-N junction having an internal junction barrier capacitance that is a function of the reverse bias across said junction, said capacitance being variable with light energy received by said junction, said second circuit element including an inductor and means including said first and said second circuit elements to provide a circuit resonant within a frequency range, said circuit elements being adapted to be energized by alternating current signals having a frequency within said range, said junction being arranged to create said reverse bias solely by rectification of said alternating current signals.

2. In combination, a first circuit element and a second circuit element, said first circuit element including a capacitor and a P-N junction having an internal junction barrier capacitance that varies inversely with the magnitude of reverse bias across said junction, said second circuit element including an inductor and means including said first and said second circuit elements to provide a resonant circuit, said circuit elements being adapted to be energized by an alternating electromotive force having a frequency within the frequency range of said resonant circuit, said junction being arranged to develop self-reverse bias by rectification of said alternating voltage as the principal bias for said junction.

3. A circuit comprising, in combination, a first circuit section and a second circuit section, connected in parallel, said first circuit section including a serially connected junction diode and capacitance means, said junction diode having a forward and a reverse direction and an internal junction barrier capacitance that varies inversely with the magnitude of potential difference across said diode in the reverse direction, whereby said circuit is resonant within a range of frequencies depending upon said junction capacitance, said second circuit section including an inductor, each of said circuit sections being adapted to be energized by alternating current signals having a frequency within said range, said diode developing the sole said potential difference by rectification of said signals, said capacitance means serving to sustain said potential difference.

4. The circuit as claimed in claim 3 including means electrically associated with said diode to vary the capacitance of said diode whereby said circuit has two distinct and stable states of operation.

5. A bistable circuit having two distinct and stable states of operation at one frequency comprising, in combination: a source of alternating current signals of a first frequency; an inductor, a variable capacitance junction diode, and a capacitor means serially connected to form a circuit resonant at a frequency on one side of and close to said one frequency when energized by said signals; means applying said signals to said circuit, said diode creating the sole reverse bias for said diode by rectification of said signals; and means for selectively causing the capacitance of said diode to change in a direction whereby the resonant frequency of said circuit is switched to a value on the other side of said one frequency.

6. The circuit as claimed in claim 5 wherein the frequency of said alternating voltage is such that variation of said reverse bias of said diode causes said circuit to pass through series resonance.

7. The circuit as claimed in claim 6 wherein said diode capacitance varying means includes means for pulse modulating said alternating current signals.

8. The circuit as claimed in claim 6 wherein said diode capacitance varying means includes means for varying the frequency of said alternating current signals.

9. A light responsive circuit for providing an output signal proportional to total light energy input comprising, in combination, a source of alternating voltage, a first inductor, a variable capacitance junction diode, a capacitor and impedance means, said combination being connected in series, said diode having a voltage sensitive variable capacitance characteristic that effectively varies with the amount of light energy received by a portion of said diode, said diode being arranged to create the principal reverse bias voltage by rectification of signals from said source, said capacitor being connected in a sense to sustain said bias voltage for maintaining said bias.

10. The circuit claimed in claim 9 wherein said alternating voltage has a frequency such that in the absence of any light energy on said diode, said diode, said capacitor, and said inductor are in series resonance.

11. The circuit as claimed in claim 9 wherein said impedance means is a second inductor adapted to be electrically resonant with said first inductor, said diode, and said capacitor.

12. A bistable circuit having two stable states of operation comprising in combination: a first inductor, a second inductor, a light sensitive semiconductor junction diode having a capacitance that varies with the magnitude of reverse bias across said diode, and a capacitor each connected in series, means including a source of alternating voltage for energizing each of said inductors, said diode and said capacitor, said first inductor, said diode, and said capacitor forming a combination that is series resonant with said second inductor in the absence of light energy received by said diode corresponding to one of said stable states of operation, and means to trigger said bistable circuit to the other one of said stable states by the application of light energy to said diode, said diode being arranged to create the principal reverse bias voltage by rectification of signals from said alternating voltage source.

13. A bistable circuit having two stable states of operation comprising, in combination, a pair of terminal points, an inductor connected to one of said terminal points, a first series circuit connected between said terminal points and including a first variable capacitance junction diode and a first capacitor, and a second series circuit connected between said junction points and in parallel with said first series circuit and including a second variable capacitance junction diode and a second capacitor, said first diode and said second diode being poled oppositely one another, each of said diodes having an internal junction barrier capacitance that varies inversely with the magnitude of reverse bias across said diode, said bistable circuit being arranged to be energized by an alternating voltage having a frequency such that a variation of said reverse bias causes said bistable circuit to pass through series resonance, each of said diodes being arranged to create its own self-reverse bias by rectification of said alternating voltage whereby said circuit has two stable states of operation.

14. A bistable circuit having two stable states of operation comprising, in combination, a first series circuit including a variable capacitance junction diode and a first capacitor, a second series circuit including a rectifying diode and a second capacitor, an inductor, said first and said second series circuits being connected in parallel with each other and in series with said inductor, said diodes being poled opposite one another, said variable capacitance diode having an internal junction barrier capacitance that varies inversely with the magnitude of reverse bias across said diode, said circuit being arranged to be energized by an alternating voltage having a frequency such that variation of said reverse bias of said diode causes said bistable circuit to pass through series resonance, said variable capacitance diode being arranged to create its own self-reverse bias by rectification of said alternating voltage whereby said circuit has two stable states of operation.

15. In combination, a variable capacitance semiconductor junction, a capacitor, and an inductor connected to form a resonant circuit, the resonant frequency of said circuit being a function of the reverse bias across said junction, and means for energizing said circuit with alternating current signals of a frequency close to said resonant frequency, said reverse bias being provided primarily by rectification of said signals by said junction.

16. The combination set forth in claim 15 wherein said reverse bias is provided solely by rectification of said signals by said junction.

17. A bistable circuit having two distinct stable operating states at the same frequency when energized by applied alternating current signals lying within a certain frequency range, said circuit comprising an inductor, a capacitor, and a semiconductor junction resonant at a frequency within said range, the resonant frequency of said circuit being dependent upon the reverse bias across said junction, means for applying said alternating current signals to said circuit, said junction supplying the main said reverse bias by rectification of said alternating current signals, and means for changing the amplitude of said applied alternating current signals to effect said bistable operation.

18. In combination, a resonant circuit comprising an inductor, a variable capacitance diode, and a capacitor, the resonant frequency of said circuit being a function of the reverse bias across said diode, and means for energizing said circuit with alternating current signals having a frequency close to said resonant frequency, said diode creating reverse bias by rectification of said alternating current signals.

References Cited in the file of this patent

UNITED STATES PATENTS

| | | |
|---|---|---|
| 2,182,377 | Guanella | Dec. 5, 1939 |
| 2,539,639 | Schoenfeld | Jan. 30, 1951 |
| 2,555,959 | Curtis | June 5, 1951 |
| 2,708,739 | Bucher | May 17, 1955 |
| 2,714,702 | Shockley | Aug. 2, 1955 |
| 2,777,956 | Kretzmer | Jan. 15, 1957 |
| 2,810,072 | Amatniek | Oct. 15, 1957 |

FOREIGN PATENTS

| | | |
|---|---|---|
| 166,800 | Australia | Feb. 6, 1956 |

OTHER REFERENCES

Shea: "Principles of Transistor Circuits," pp. 8–12.

Terman: Radio Engineers Handbook, 1st edition, page 554.